(12) United States Patent
Groetsch et al.

(10) Patent No.: US 7,723,730 B2
(45) Date of Patent: May 25, 2010

(54) CARRIER LAYER FOR A SEMICONDUCTOR LAYER SEQUENCE AND METHOD FOR PRODUCING SEMICONDUCTOR CHIPS

(75) Inventors: Stefan Groetsch, Lengfeld/Bad Abbach (DE); Stefan Illek, Donaustauf (DE); Andreas Ploessl, Regensburg (DE); Berthold Hahn, Hemau (DE)

(73) Assignee: Osram Opto Semiconductors GmbH, Regensburg (DE)

( * ) Notice: Subject to any disclaimer, the term of this patent is extended or adjusted under 35 U.S.C. 154(b) by 0 days.

(21) Appl. No.: 10/999,854

(22) Filed: Nov. 29, 2004

(65) Prior Publication Data
US 2005/0127382 A1 Jun. 16, 2005

(30) Foreign Application Priority Data
Nov. 28, 2003 (DE) .................. 103 55 600

(51) Int. Cl.
*H01L 33/00* (2006.01)
(52) U.S. Cl. .................. 257/79; 257/99; 257/774; 257/E33.001; 257/E33.066; 257/E33.075
(58) Field of Classification Search .................. 257/79, 257/99, 774, E33.001, E33.066, E33.075
See application file for complete search history.

(56) References Cited

U.S. PATENT DOCUMENTS

| | | | |
|---|---|---|---|
| 5,770,821 A | 6/1998 | Hikasa et al. | |
| 6,106,891 A * | 8/2000 | Kulesza et al. | 427/97.2 |
| 6,352,014 B1 | 3/2002 | Goland et al. | |
| 6,395,572 B1 | 5/2002 | Tsutsui et al. | |
| 6,996,281 B2 * | 2/2006 | Boliek et al. | 382/236 |
| 6,998,281 B2 * | 2/2006 | Taskar et al. | 438/29 |
| 7,345,350 B2 * | 3/2008 | Sinha | 257/449 |
| 2002/0175621 A1 | 11/2002 | Song et al. | |
| 2003/0209714 A1 | 11/2003 | Taskar et al. | |
| 2003/0213964 A1 | 11/2003 | Flynn et al. | |
| 2004/0033638 A1 | 2/2004 | Bader et al. | |

FOREIGN PATENT DOCUMENTS

| | | |
|---|---|---|
| DE | 686 07 531 | 1/2001 |
| DE | 100 17 336 | 10/2001 |
| EP | 1 564 803 | 8/2005 |
| JP | 07231049 A | 8/1995 |
| WO | WO 95/04165 | 2/1995 |
| WO | WO 02/33760 A1 | 10/2001 |
| WO | WO 03/062507 A2 | 1/2003 |
| WO | WO 03/094220 | 11/2003 |

OTHER PUBLICATIONS

English Translation of the Office Action dated Oct. 3, 2007 for the corresponding Taiwanese Patent Application No. 93135404.

* cited by examiner

*Primary Examiner*—Victor A Mandala
(74) *Attorney, Agent, or Firm*—Cohen Pontani Lieberman & Pavane LLP

(57) ABSTRACT

A carrier layer (1) for a semiconductor layer sequence comprising an electrical insulation layer (2) containing AlN or a ceramic. Furthermore a method for producing semiconductor chips is described.

28 Claims, 3 Drawing Sheets

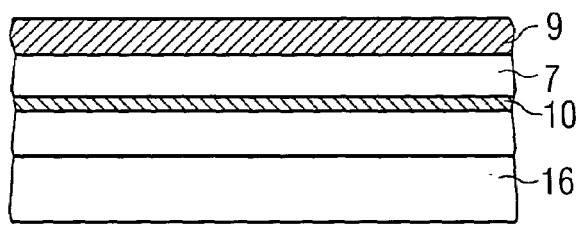
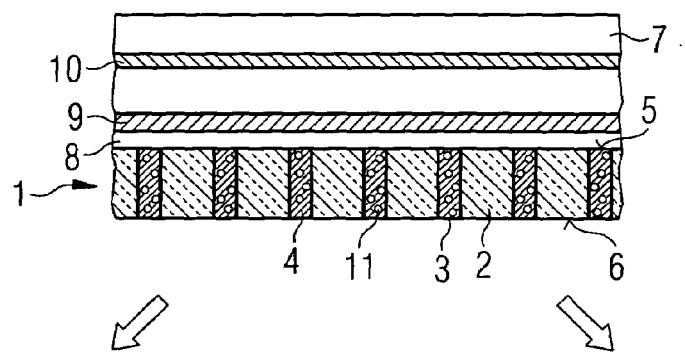
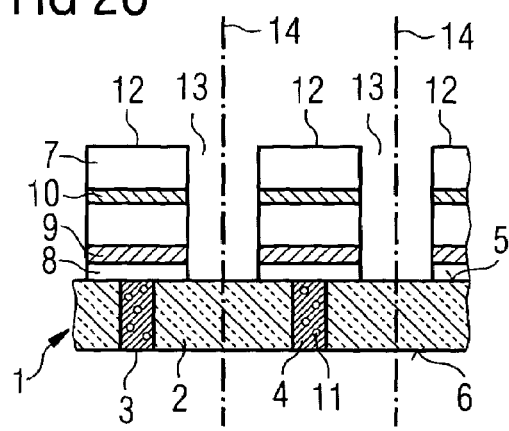
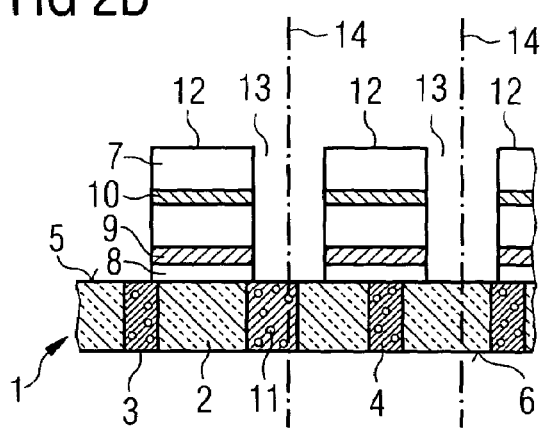

FIG 2E
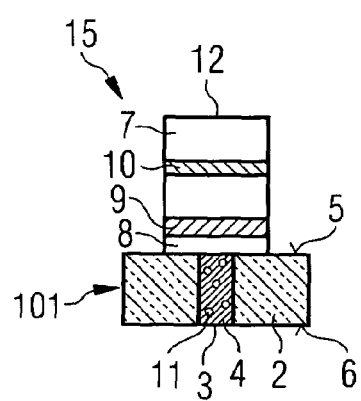
FIG 2F
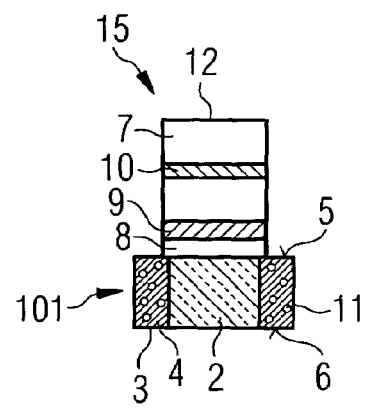

CARRIER LAYER FOR A SEMICONDUCTOR LAYER SEQUENCE AND METHOD FOR PRODUCING SEMICONDUCTOR CHIPS

RELATED APPLICATIONS

This patent application claims the priority of German Patent Application No. 103 55 600.1 filed Nov. 28, 2003, the disclosure content of which is hereby incorporated by reference.

FIELD OF THE INVENTION

The present invention relates to a carrier layer for a semiconductor layer sequence, and particularly to a carrier layer comprising an electrical insulation layer.

BACKGROUND OF THE INVENTION

In the context of the invention, a carrier layer is regarded as a layer on which the semiconductor layer sequence is arranged in the course of its processing. In particular, this is done prior to a singulation into semiconductor chips which comprise semiconductor chip regions and the latter in turn comprise a part of the semiconductor layer sequence. In particular, the semiconductor layer sequence is intended for forming a plurality of semiconductor chip regions. Said semiconductor chips may subsequently be processed further for semiconductor components. The carrier layer is at any rate to be differentiated from a growth substrate of the abovementioned semiconductor layer sequence.

A carrier layer of this type should be well matched to the semiconductor layer sequence with regard to its coefficient of expansion, in order to avoid strains that are damaging to the semiconductor layer sequence in the event of heating, and have a high thermal conductivity, in order to ensure a good dissipation of heat from the semiconductor layer sequence, in particular the later semiconductor chip (i.e., the chip formed after singulation). For the case where the electrical contact connection of the semiconductor layer sequence is effected through the carrier layer, the electrical conductivity thereof is to be chosen to be appropriately high.

Carrier layers made of semiconductor materials, such as Ge or GaAs, and made of metals, such as Mo or CuW, are known, by way of example.

If metallic carrier layers are used, which usually have a high thermal conductivity, then during singulation, which is often effected by sawing, the risk may be increased of metal slivers or warpage arising on the metal, which render the semiconductor chip unusable, for example due to a short circuit. Frequently, the coefficient of thermal expansion is also inadequately matched to the semiconductor layer sequence and strains may arise between the carrier layer and the semiconductor layer sequence in the event of heating, which have a damaging effect on the semiconductor layer sequence.

By contrast, semiconductor materials, in comparison with metals, often have lower thermal or electrical conductivities and often have a lower mechanical stability, in particular with regard to brittlements, thereby increasing the risk of damage to the semiconductor layer sequence and thus the later semiconductor chips. With regard to the coefficients of thermal expansion, however, semiconductor materials are usually better matched to the semiconductor layer sequence than metals.

Furthermore, a chip carrier made of an electrically insulating AlN ceramic is known, on which semiconductor chips can be arranged after singulation. These chip carriers may have a conductor structure that enables the semiconductor chip to be electrically contact-connected from that side of the chip carrier which is opposite to the chip. Said conductor structure may comprise plated-through holes through the chip carrier, so-called vias, which are filled with tungsten. Chip carriers of this type are distinguished by a good thermal conductivity. With regard to their coefficients of expansion, chip carriers of this type can be matched to the semiconductor layer sequence by means of suitable process implementation during production. Since each individual chip is assigned a chip carrier of this type, the production of such chips is cost- and time-intensive.

SUMMARY OF THE INVENTION

One object of the present invention is to provide a carrier layer for a semiconductor layer sequence of the type mentioned in the introduction, having an improved matching with regard to its thermal properties, in particular the coefficient of expansion, to the semiconductor layer sequence.

Another object is to provide a production method for semiconductor chips using a carrier layer of this type.

This and other objects are attained in accordance with one aspect of the present invention directed to a carrier layer for a semiconductor layer sequence, the carrier layer comprising an electrical insulation layer, wherein the insulation layer contains AlN.

The AlN is preferably formed as ceramic and/or in radiation-opaque fashion. A ceramic containing aluminum nitride is particularly suitable as the carrier layer. The semiconductor layer sequence is arranged for example on a first main area of the carrier layer.

A carrier layer for a semiconductor layer sequence according to another aspect of the invention comprises an electrical insulation layer containing a ceramic. A ceramic containing carrier layer is particularly suitable as a carrier layer. The ceramic preferably contains an aluminum nitride or an aluminum oxide.

It should be noted that, in the context of the present invention, the term semiconductor layer sequence is to be understood as a general succession of semiconductor layers arranged one above the other, such as, for example, the semiconductor layers of a semiconductor wafer that have been grown for example epitaxially on a growth substrate.

A carrier layer of this type has the advantage of a high thermal conductivity, which may in the case of an AlN containing carrier layer for example be as much as 230 W/mK. Furthermore, the risk of a short circuit being caused in the later semiconductor chips during singulation is at least greatly reduced by virtue of the electrically insulating ceramic or of the electrically insulating AlN, respectively. The thermal expansion properties of the carrier layer and of the semiconductor layer sequence are advantageously matched to one another, in particular for protection against strains. This may be achieved for example by means of a suitable process implementation during the production of the carrier layer.

Furthermore, a carrier layer of this type may be distinguished by an advantageously high stability compared with carrier layers made of semiconductor materials such as Ge or GaAs. For this purpose, the carrier layer is preferably formed in self-supporting fashion, so that it mechanically stabilizes its inherent weight and, particularly preferably, the semiconductor layer sequence as well. The thickness of the insulation layer is preferably greater than 50 µm, particularly preferably greater than 100 µm.

The semiconductor layer sequence may be connected to the carrier layer by means of a connecting layer formed for example by a solder, eutectic bonding with suitable metal layers or adhesive bonding. This connection is preferably formed in electrically conductive fashion.

In one embodiment of the invention, the semiconductor layer sequence comprises a radiation-generating active zone, for example a pn junction, a single or multiple quantum well structure. The semiconductor layer sequence may be formed for LED chips, radiation-emitting semiconductor components with a resonator, such as edge-emitting lasers or vertically emitting components such as VCSEL, VECSEL or RCLEDs. Preferably, the wavelength of the radiation generated lies in the ultraviolet to infrared spectral range.

The high thermal conductivity of the carrier layer is advantageous precisely in the case of the lasers mentioned since the heat arising in said components is usually considerable and is advantageously dissipated from the component in order not to impair the function thereof. An additional heat sink may particularly advantageously be dispensed with in the case of lasers and also in the case of the further components presented above.

The semiconductor layer sequence can contain at least one III-V semiconductor material, comprising $In_xGa_yAl_{1-x-y}P$, $In_xGa_yAl_{1-x-y}N$ or $In_xGa_yAl_{1-x-y}As$, in each case where $0 \leq x \leq 1$, $0 \leq y \leq 1$ and $x+y \leq 1$. The active zone particularly preferably contains at least one of said materials.

In another embodiment of the invention, a mirror layer is arranged downstream of the active zone, for example between the active zone and the first main area of the carrier layer. Said mirror layer may comprise for example a distributed Bragg mirror, preferably formed in the semiconductor layer sequence, and/or a metal layer, for example containing Au, Al, Ag, Pt or alloys having at least one of said materials. The mirror layer is preferably formed in electrically conductive fashion and/or electrically conductively connected to the semiconductor layer sequence and may be part of an optical resonator, for example for a vertically emitting component. A mirror layer of this type advantageously increases the efficiency of a later semiconductor chip.

In another embodiment of the carrier layer, the latter has a conductor structure, which electrically conductively connects the first main area to a second main area opposite thereto and thereby enables the semiconductor layer sequence to be electrically contact-connected from the second main area of the carrier layer.

Said conductor structure can comprise cutouts in the carrier layer that reach from the first to the second main area. Arranged in said cutouts is an electrically conductive material, for example a metal such as, for instance, W, Cu, Ag or Au or an alloy having at least one of said materials, which is electrically conductively connected to the semiconductor layer sequence.

The material in the cutout is well matched to the ceramic or to the AlN, respectively, in particular with regard to the mechanical and thermal properties. In an advantageous manner, the strains that may occur between the insulation layer and the material in the cutout are thereby reduced and the stability of the carrier layer with the conductor structure is consequently increased. W, for example, fulfils these conditions at least with regard to the coefficient of thermal expansion and with regard to AlN. A carrier layer of this type made of AlN with a conductor structure containing W may be well matched to the semiconductor layer sequence, in particular with regard to the coefficients of expansion. Thus, the risk of damage to the semiconductor layer sequence due to strains that are caused thermally is reduced and, more widely, the electrical contact connection of the semiconductor layer sequence by means of the second main area of the carrier layer is made possible. Furthermore, the thermal conductivity with 195 W/mK, for example, may also advantageously be increased compared with carrier layers made of semiconductor materials.

In another embodiment of the conductor structure, an additional thermally conductive substance, for example in the form of diamond particles, is introduced into said conductor structure, said substance being arranged in the cutout and having a higher thermal conductivity than the electrically conductive material in the cutout. This thermally conductive substance advantageously increases the thermal conductivity of the conductor structure, in particular in the region of the cutout and consequently that of the carrier layer comprising the cutouts. Furthermore, the thermally conductive substance may improve the matching of the mechanical properties of the electrically conductive material in the cutout to that of the insulation layer since the proportion of electrically conductive material in the cutout is reduced at the expense of the thermally conductive substance, which advantageously has suitable mechanical and thermal properties, for this purpose.

Another aspect of invention is directed to a method for producing semiconductor chips with a semiconductor chip region that has a radiation-generating active zone and is arranged on a chip carrier containing AlN in a first variation or a ceramic in a second variation. Firstly, a semiconductor layer sequence is produced on a substrate, such as by epitaxial growth on a growth substrate. The semiconductor layer sequence is subsequently arranged on an AlN-containing or a ceramic containing carrier layer, respectively, whereupon the substrate is removed.

The carrier layer or the semiconductor layer sequence are preferably formed as in the corresponding embodiments above, so that the carrier layer comprises for example a conductor structure or the carrier layer and the semiconductor layer sequence may have other features from the features mentioned there. Further embodiments from the above embodiments may also be applied correspondingly to the method. Thus, by way of example, a metallic mirror layer may be applied, preferably by sputtering or vapour deposition, onto the semiconductor layer sequence, on the side remote from the substrate, prior to arrangement on the carrier layer.

From the side opposite to the carrier layer, the semiconductor layer sequence is thereupon patterned into semiconductor chip regions that are preferably spatially separate from one another, and the structure comprising semiconductor chip regions and carrier layer is singulated, for example by sawing or a laser separating method, into semiconductor chips in such a way that the semiconductor chips in each case comprise at least one semiconductor chip region. In this case, the singulation can be effected in the interspaces between the semiconductor chip regions. The semiconductor chip is arranged on a chip carrier containing a ceramic or AlN, respectively, after singulation, and which chip carrier emerges from the carrier layer during singulation. Semiconductor chips produced by removal of the growth substrate and arrangement of the semiconductor layer sequence on a carrier layer are referred to as thin-film chips.

The patterning of the semiconductor layer sequence may also be wholly or partly effected while the semiconductor layer sequence is still arranged on the substrate, that is to say prior to arrangement on the carrier, and is not restricted to the formation of the semiconductor chip regions. Rather, it is also possible to provide structures that improve the coupling-out of light from the semiconductor chip, protect the chip from damaging effects, or to carry out other processes during the patterning.

After singulation, essentially each semiconductor chip region can be electrically conductively connected to the conductor structure.

Such a production method for semiconductor chips has the advantage that, in a continuous process, it is possible to produce semiconductor chips which are arranged on an AlN-containing or respectively a ceramic containing chip carrier that is well matched to the semiconductor layer sequence with regard to the coefficient of expansion and has an advantageously high thermal conductivity. In particular, the chips do not have to be arranged individually on the chip carrier since the latter emerges from the carrier layer during singulation, as a result of which the production duration and production costs of semiconductor chips of this type are reduced.

BRIEF DESCRIPTION OF THE DRAWINGS

Further features, advantages and expedients of the invention will become apparent from the descriptions of the following exemplary embodiments in conjunction with the figures.

FIG. 2 shows a diagrammatic illustration of an exemplary embodiment of a method according to the invention for producing a semiconductor chip, on the basis of intermediate steps, in FIGS. 2A to 2F.

DETAILED DESCRIPTION OF THE DRAWINGS

Elements that are of the same type and act identically have identical reference symbols in the figures.

Figure 1A:
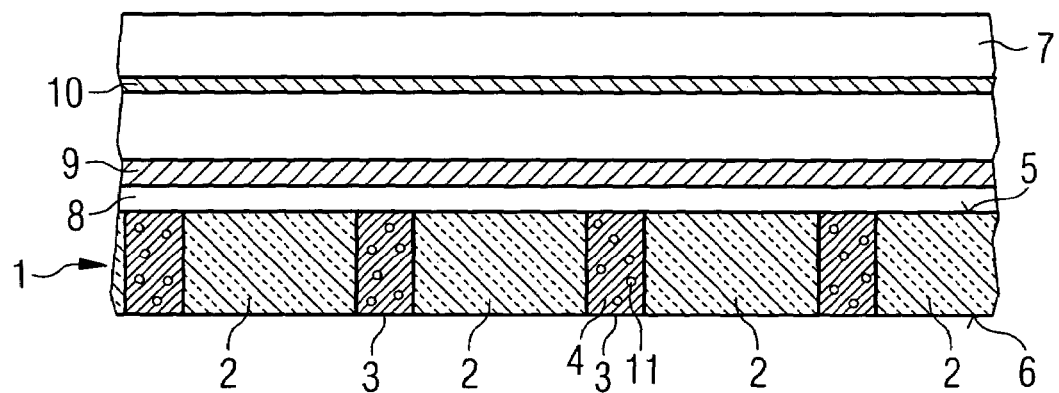
FIG. 1A shows a diagrammatic sectional view of a part of an exemplary embodiment of a carrier layer according to the invention.

FIG. 1A shows a diagrammatic sectional view of a part of a first exemplary embodiment of a carrier layer according to the invention.

The carrier layer 1 comprises an insulation layer 2 containing AlN, in particular an AlN ceramic, having a thickness of 200 μm, for example. Cutouts 3 are provided in the insulation layer 2, an electrical conductor material 4, for example W, being arranged in said cutouts in such a way that a first main area 5 of the carrier layer 1 is electrically conductively connected to a second main area 6. Arranged over the carrier layer 1 is a semiconductor layer sequence 7, which is connected to the carrier layer 1 by means of a connecting layer 8 and a mirror layer 9. The connecting layer 8 is formed in electrically conductive fashion, for example as solder, so that the radiation-generating active zone 10 of the semiconductor layer sequence 7 is conductively connected to the conductor material 4 by means of the electrically conductive mirror layer 9.

The carrier layer 1 is formed in self-supporting fashion, mechanically stabilizes the semiconductor layer sequence 7 and ensures that the semiconductor layer sequence 7 can be electrically contact-connected by means of the cutouts 4 from the second main area 6. Furthermore, the carrier layer 1, with W in the cutouts, has a high thermal conductivity, for example of 195 W/mK, which is additionally increased by introducing a thermally conductive substance 11, for example diamond particles, into the electrical conductor material in the cutout 3. Moreover, in particular by means of the process implementation during the production of the insulation layer 2, the carrier layer 1 may be matched to the coefficients of thermal expansion of the semiconductor layer sequence in such a way that the latter is improved compared with metallic carrier layers. Furthermore, a carrier layer of this type has an increased electrical and thermal conductivity compared with most semiconductor materials at least in the region of the cutouts 4.

In this case, the semiconductor layer sequence 7 may be formed for LED chips, radiation-emitting semiconductor components with a resonator, such as edge-emitting lasers or vertically emitting components such as VCSEL, VECSEL or RCLEDs, and the mirror layer 9 may comprise for example a metal layer or a distributed Bragg mirror that may be formed in the semiconductor layer sequence 7.

Figure 1B:
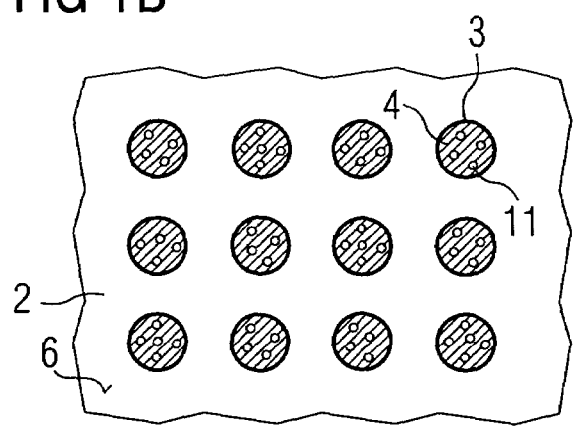
FIG. 1B shows a plan view of a part of an exemplary embodiment of a carrier layer according to the invention.

FIG. 1B illustrates a plan view of a part of an exemplary embodiment of a carrier layer according to the invention.

The illustration shows a part of a plan view of the second main area 6 of a carrier layer 1, such as, for instance, that from FIG. 1A. In this exemplary embodiment, the cutouts 3 in the insulation layer 2 with the conductor material 4 and the thermally conductive substance 11 are arranged in a regular grid, which proves to be advantageous for the further processing, in particular during the production of semiconductor chips using a carrier layer 1 of this type (cf. FIG. 2 and the associated description), and have a circular cross section, for example, in plan view. FIG. 1B illustrates as an example of a regular grid a square lattice, at the lattice points of which a cutout 3 is respectively arranged.

The cutouts 3 are stamped into the still soft AlN material ("green sheet"; a green sheet is a ceramic compound which is still soft, but may nevertheless be formed or patterned, such that the patterned structure, e.g., vias, keeps its shape; afterward the green sheet is sintered to stabilize the patterned structure resulting in a mechanically stable and solid ceramic carrier layer), for example, in order to produce a carrier layer of this type. In this case, the tools used determine the form of the cross section of the cutouts.

Afterward, in a first embodiment, a W paste as conductor material 4 and the thermally conductive substance 11 may be introduced into the cutout 3. The carrier layer 1 is then completed by sintering and the semiconductor layer sequence 7 may be arranged on the carrier layer 1 in the manner illustrated in FIG. 1A.

In a second embodiment, the AlN material is sintered after the production of the cutouts 3 and the semiconductor layer sequence 7 is then arranged on the AlN material. The conductor material 4 may thereupon be introduced into the cutouts 3 by means of a galvanic procedure. This process may advantageously be carried out at temperatures that are not harmful to the semiconductor layer sequence 7. A conductor material 4 containing Ag or Cu is preferably used for this purpose.

FIG. 2 shows a diagrammatic illustration of an exemplary embodiment of a method according to the invention for producing a semiconductor chip, on the basis of intermediate steps illustrated in FIGS. 2A to 2F.

The production of an LED thin-film chip with a mirror layer is described in this exemplary embodiment. However, the method illustrated may be correspondingly applied to chips that are formed for LEDs, RCLEDs and also for lasers such as VCSEL, VECSEL or edge-emitting lasers or for other types of semiconductor chips.

A semiconductor layer sequence 7, for example containing $In_xGa_yAl_{1-x-y}P$ or $In_xGa_yAl_{1-x-y}N$, grown epitaxially on a growth substrate 16, with a radiation-generating active zone 10, is provided with a mirror layer 9 in a first intermediate step in FIG. 2A. For $In_xGa_yAl_{1-x-y}P$, the growth substrate 16 is preferably of GaAs and the mirror layer is made of Au; for In$_x$Ga$_y$Al$_{1-x-y}$N, for example sapphire or SiC are suitable as growth substrates and Ag or Al are suitable as material for the mirror layer. The, particularly metal-containing, mirror layer 9 is preferably applied by sputtering or vapor deposition onto that side of the semiconductor layer sequence 7 which is remote from the growth substrate 16.

Afterward, the mirror layer 9 is fixed on a first main area 5 of the carrier layer 1 by means of an electrically conductive connecting layer 8, for example a solder. The carrier layer 1 has an electrical insulation layer 2 made of AlN, in particular an AlN ceramic, in which cutouts 3 are provided, a conductor material 4, for example W, being arranged in said cutouts, and a thermally conductive substance 11, for example in the form of diamond particles, in turn being arranged in said conductor material. The conductor structure comprising the cutouts 3 with the conductor material 4 permits the semiconductor layer sequence 7 to be electrically contact-connected from a second main area 6 of the carrier layer 1 opposite to the first main area 5. The electrical contact is effected by means of the conductor material 4, which is electrically conductively connected to the semiconductor layer sequence 7 by means of the conductive connecting layer 8 and the mirror layer 9.

The growth substrate 16 is thereupon removed preferably by etching, mechanical loading or a laser ablation method, which results in the structure shown in FIG. 2B with the carrier layer 1 and the semiconductor layer sequence 7 arranged thereon.

A carrier layer of this type is particularly suitable for use in the case of semiconductor layer sequences containing In$_x$Ga$_y$Al$_{1-x-y}$P or In$_x$Ga$_y$Al$_{1-x-y}$N, since AlN with approximately 4.4 ppm/° C. has a coefficient of thermal expansion that is well matched to those of the growth substrates GaAs and sapphire, having values of approximately 6 and 4.5 ppm/° C., respectively. Furthermore, the thermal conductivity of a carrier layer according to the invention with approximately 195 W/mK is also advantageously increased compared with carrier layers made of semiconductor materials such as GaAs, for example, which has a thermal conductivity of approximately 55 W/mK.

In a further-reaching method step, the semiconductor layer sequence 7 is patterned, for example by masking and etching techniques, into semiconductor chip regions 12 in such a way that the latter are spatially separated from one another by interspaces 13. Furthermore, the semiconductor chip regions 12 may be provided with radiation-coupling out, passivation or protection structures that advantageously increase the coupling-out of radiation from the later semiconductor chip or protect the chip from damaging effects. The patterning may also be wholly or partly effected while the semiconductor layer sequence 7 is still arranged on the growth substrate 16.

FIGS. 2C and 2D show the semiconductor chip regions 12 arranged on the carrier layer 1 after the above patterning process.

In FIG. 2C, no conductor material 4 is arranged in the region of the interspaces 13, in contrast to FIG. 2D.

The arrangement illustrated in FIG. 2C therefore requires a high alignment outlay, either during the patterning of the semiconductor layer sequence 7 on the carrier layer 1 or during the arrangement of the already partly or completely patterned semiconductor layer sequence 7 on the carrier layer 1. In particular, the cutouts 3 in the carrier layer 1, during the production thereof, must also be arranged in accordance with the size of a later semiconductor chip. The advantage of such an arrangement of the conductor material 4 is that the singulation of the structure illustrated, for example by sawing, along the separating lines 14 into semiconductor chips 15, as illustrated in FIG. 2E, is effected only in the electrically insulating AlN. This at least greatly reduces the risk of a damaging short circuit of the active zone 10 of the semiconductor chip due to slivers of the semiconductor material 4 arising during singulation. Preferably, each semiconductor chip region 12 is thus assigned at least one cutout 3 with the conductor material 4, which is completely covered by the semiconductor chip region 12.

In the arrangement shown in FIG. 2D, conductor material 4 is arranged in the region of some interspaces 13. This has the advantage of a lower necessary alignment outlay compared with the arrangement in FIG. 2C. During the patterning of the semiconductor layer sequence 7 or the arrangement on the carrier layer 1, it is merely necessary to ensure that essentially each semiconductor chip region 2 is connected to the conductor material. This may be achieved for example by means of a correspondingly high density of cutouts 3 with conductor material 4 in the insulation layer 2.

If singulation into semiconductor chips 15 is subsequently effected along the separating lines 14, as illustrated in FIG. 2F, then this is done at least partly in the conductor material 4, whereby the risk of a short circuit of the active zone 10 may be increased. However, if the conductor material 4 is W, for example, which has a high hardness, it is possible to reduce the formation of W slivers during singulation, for example by sawing, which in turns reduces the risk of a short circuit. When sawing in tungsten, however, the "saw blade" may become blunt, which can be compensated for by sawing in the AlN ceramic again since ceramics are often used to sharpen the "saw blades".

The semiconductor chips 15 illustrated in FIGS. 2E and 2F in each case comprise one semiconductor chip region 12 arranged on a chip carrier 101 that emerges from the carrier layer 1 during singulation. The semiconductor chip regions 12 can be electrically contact-connected by means of the conductor material from the second main area 6 and the chip carrier 101 ensures a good dissipation of heat from the semiconductor chip region 12. The mirror layer 9 reflects the radiation generated in the active zone 10 and thus increases the efficiency of the semiconductor chip 15.

Such a production method for semiconductor chips has the advantage that the AlN-containing carrier layer can be processed conjointly with the semiconductor layer sequence. Consequently, it is not necessary for each individual semiconductor chip 15 to be equipped with a chip carrier 101 of this type, thereby reducing the production costs and the required production time for semiconductor chips on a chip carrier of this type.

Furthermore, an additional heat sink can advantageously be dispensed with owing to the high thermal conductivity of the carrier layer. In order to increase the thermal capacity of the chip carrier 101, the volume thereof may be increased for example by larger interspaces 13 or a thicker carrier layer 1.

The scope of protection of the invention is not limited to the examples given herein above. The invention is embodied in each novel characteristic and each combination of characteristics, which particularly includes every combination of any features which are stated in the claims, even if this feature or this combination of features is not explicitly stated in the claims or in the examples.

We claim:

1. A semiconductor chip comprising:
   an epitaxial semiconductor chip region and a chip carrier, the semiconductor chip region being arranged on the chip carrier,
   wherein the semiconductor chip is free of a growth substrate for the epitaxial semiconductor chip region;

the chip carrier comprises an electrical insulation layer, and the electrical insulation layer contains at least one of AlN and a ceramic.

2. The semiconductor chip as claimed in claim 1, wherein the electrical insulation layer contains an AlN ceramic.

3. The semiconductor chip as claimed in claim 1, wherein the electrical insulation layer is formed in self-supporting fashion.

4. The semiconductor chip as claimed in claim 1, wherein the chip carrier has a conductor structure that comprises an electrical conductor material.

5. The semiconductor chip as claimed in claim 4, wherein the chip carrier has a first main area facing the semiconductor chip region and a second main area facing away from the semiconductor chip region, and the conductor structure extends from the first main area to the second main area.

6. The semiconductor chip as claimed in claim 5, wherein the conductor structure is at least partly formed in cutouts of the electrical insulation layer that extend from the first main area to reach the second main area of the chip carrier.

7. The semiconductor chip as claimed in claim 4, wherein the semiconductor chip region is electrically conductively connected to the conductor structure.

8. The semiconductor chip as claimed in claim 4, wherein the electrical conductor material is one of a metal and an alloy.

9. The semiconductor chip as claimed in claim 8, wherein the electrical conductor material is at least one of W, Ag, Au and Cu, or an alloy having at least one of W, Ag, Au and Cu.

10. The semiconductor chip as claimed in claim 4, wherein the conductor structure comprises a thermally conductive substance for increasing the thermal conductivity of the conductor structure.

11. The semiconductor chip as claimed in claim 1, wherein the semiconductor chip region has a radiation-generating active zone.

12. The semiconductor chip as claimed in claim 11, wherein a mirror layer is arranged downstream of the active zone.

13. The semiconductor chip as claimed in claim 12, wherein the mirror layer is electrically conductively connected to the semiconductor chip region.

14. The semiconductor chip as claimed in claim 12, wherein the mirror layer is arranged between the first main area of the chip carrier and the active zone.

15. The semiconductor chip as claimed in claim 1, wherein the semiconductor chip region is formed for an LED chip or a radiation-emitting component with a resonator.

16. The semiconductor chip as claimed in claim 1, wherein the semiconductor chip region contains at least one III-V semiconductor material, comprising $In_xGa_yAl_{1-x-y}P$, $In_xGa_yAl_{1-x-y}N$ or $In_xGa_yAl_{1-x-y}As$, in each case where $0 \leq x \leq 1$, $0 \leq y \leq 1$ and $x+y \leq 1$.

17. The semiconductor chip as claimed in claim 1, wherein the chip carrier has a coefficient of thermal expansion which matches a coefficient of thermal expansion of the semiconductor chip region.

18. The semiconductor chip as claimed in claim 1, wherein the chip carrier has a thermal conductivity higher than 195 W/mK.

19. The semiconductor chip as claimed in claim 18, wherein the thermal conductivity of the chip caffier is 230 W/mK.

20. The semiconductor chip as claimed in claim 10, wherein the electrical conductor material has a first thermal conductivity, and the thermally conductive substance has a second thermal conductivity which is higher than the first thermal conductivity.

21. The semiconductor chip as claimed in claim 15, wherein the radiation-emitting component with a resonator is an edge-emitting laser or a vertically emitting component.

22. The semiconductor chip as claimed in claim 21, wherein the vertically emitting component is a VCSEL, a VECSEL or an RCLED.

23. The semiconductor chip as claimed in claim 12, wherein the semiconductor chip region is fixed on the chip carrier by means of an electrically conductive connecting layer which is arranged between the mirror layer and the chip carrier.

24. The semiconductor chip as claimed in claim 23, wherein the connecting layer is formed by a solder, by eutectic bonding or by adhesive bonding.

25. The semiconductor chip as claimed in claim 1, wherein the semiconductor chip region comprises a plurality of semiconductor layers grown epitaxially on a growth substrate, the growth substrate being removed from the semiconductor layers after the semiconductor layers have been grown epitaxially.

26. The semiconductor chip as claimed in claim 12, wherein the mirror layer comprises a metal layer.

27. A carrier layer for a semiconductor layer sequence, the carrier layer comprising:
a first main area facing the semiconductor layer sequence;
a second main area opposite to the first main area and facing away from the semiconductor layer sequence;
an electrical insulation layer containing a ceramic and having cutouts therethrough; and
conductor structures at least partly formed in the respective cutouts and extending from the first main area to reach the second main area,
wherein each of the conductor structures comprises an electrical conductor material and a thermally conductive substance, the thermally conductive substance having a higher thermal conductivity than the electrical conductor material and being introduced into said conductor structures as particles.

28. The carrier layer as claimed in claim 27, wherein the particles are diamond particles.

* * * * *